United States Patent
Boettiger et al.

(10) Patent No.: US 7,808,063 B2
(45) Date of Patent: Oct. 5, 2010

(54) STRUCTURE AND METHOD FOR FPN REDUCTION IN IMAGING DEVICES

(75) Inventors: Ulrich C. Boettiger, Boise, ID (US); John Ladd, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1532 days.

(21) Appl. No.: 11/137,446

(22) Filed: May 26, 2005

(65) Prior Publication Data

US 2006/0268143 A1 Nov. 30, 2006

(51) Int. Cl.
*H01L 29/04* (2006.01)
*H01L 31/036* (2006.01)
*H01L 31/00* (2006.01)
*H01L 27/14* (2006.01)

(52) U.S. Cl. .................. 257/432; 257/72; 257/443
(58) Field of Classification Search ......... 257/431–466, 257/72, E29.273, E31, E21
See application file for complete search history.

(56) References Cited

U.S. PATENT DOCUMENTS

| | | | |
|---|---|---|---|
| 3,971,065 A | 7/1976 | Bayer | |
| 5,471,515 A | 11/1995 | Fossum et al. | |
| 6,333,205 B1 | 12/2001 | Rhodes | |
| 6,376,868 B1 | 4/2002 | Rhodes | |
| 6,783,900 B2 | 8/2004 | Venkataraman | |
| 2003/0211405 A1* | 11/2003 | Venkataraman | 430/7 |

* cited by examiner

*Primary Examiner*—Cuong Q Nguyen
(74) *Attorney, Agent, or Firm*—Dickstein Shapiro LLP (57) ABSTRACT

Imaging devices having reduced fixed pattern noise are disclosed. The fixed pattern noise in the imaging devices is reduced by measuring and adjusting the spectral characteristics of the imager device on a pixel by pixel basis. The fixed pattern noise of the pixel cells are changed by modifying the absorption, reflectance, refractive index, shape, and/or micro structure of the material.

26 Claims, 8 Drawing Sheets

STRUCTURE AND METHOD FOR FPN REDUCTION IN IMAGING DEVICES

FIELD OF THE INVENTION

The invention relates to improved semiconductor imaging devices and, in particular, to CCD and CMOS imagers having reduced fixed pattern noise.

BACKGROUND OF THE INVENTION

The semiconductor industry currently uses different types of semiconductor-based imagers, such as charge coupled devices (CCDs), complementary metal oxide semiconductor (CMOS) devices, photodiode arrays, charge injection devices and hybrid focal plane arrays, among others.

Solid-state image sensors, also known as imagers, were developed in the late 1960s and early 1970s primarily for television image acquisition, transmission, and display. An imager absorbs incident radiation of a particular wavelength (such as optical photons, x-rays, or the like) and generates an electrical signal corresponding to the absorbed radiation. There are a number of different types of semiconductor-based imagers, including CCDs, photodiode arrays, charge injection devices (CIDs), hybrid focal plane arrays, and CMOS imagers. Current applications of solid-state imagers include cameras, scanners, machine vision systems, vehicle navigation systems, video telephones, computer input devices, surveillance systems, auto focus systems, star trackers, motion detector systems, image stabilization systems and other image based systems.

These imagers typically consist of an array of pixel cells containing photosensors, where each pixel cell produces a signal corresponding to the intensity of light impinging on that element when an image is focused on the array. These signals may then be used, for example, to display a corresponding image on a monitor or otherwise used to provide information about the optical image. The photosensors are typically photogates, phototransistors, photoconductors or photodiodes, where the conductivity of the photosensor or the charge stored in a diffusion region corresponds to the intensity of light impinging on the photosensor. The magnitude of the signal produced by each pixel cell, therefore, is proportional to the amount of light impinging on the photosensor.

Active pixel sensor (APS) imaging devices are described in U.S. Pat. No. 5,471,515. These imaging devices include an array of pixel cells, arranged in rows and columns, that convert light energy into electric signals. Each pixel includes a photodetector and one or more active transistors. The transistors typically provide amplification, read-out control and reset control, in addition to producing the electric signal output from the cell.

While CCD technology has a widespread use, CMOS imagers are being increasingly used as low cost imaging devices. A fully compatible CMOS sensor technology enabling a higher level of integration of an image array with associated processing circuits would be beneficial to many digital imager applications.

A CMOS imager circuit includes a focal plane array of pixel cells, each one of the cells including a photoconversion device, for example, a photogate, photoconductor, phototransistor, or a photodiode for accumulating photo-generated charge in a portion of the substrate. A readout circuit is connected to each pixel cell and includes at least an output transistor, which receives photogenerated charges from a doped diffusion region and produces an output signal which is periodically read out through a pixel access transistor. The imager may optionally include a transistor for transferring charge from the photoconversion device to the diffusion region or the diffusion region may be directly connected to or part of the photoconversion device. A transistor is also typically provided for resetting the diffusion region to a predetermined charge level before it receives the photoconverted charges.

In a CMOS imager, the active elements of a pixel cell perform the necessary functions of: (1) photon to charge conversion; (2) accumulation of image charge; (3) transfer of charge to a floating diffusion region accompanied by charge amplification; (4) resetting the floating diffusion region to a known state; (5) selection of a pixel for readout; and (6) output and amplification of a signal representing pixel charge. Photo-charge may be amplified when it moves from the initial charge accumulation region to the floating diffusion region. The charge at the floating diffusion region is typically converted to a pixel output voltage by a source follower output transistor.

Each pixel cell receives light focused through one or more micro-lenses. Micro-lenses on a CMOS imager help increase optical efficiency and reduce cross talk between pixel cells. A reduction of the size of the pixel cells allows for a greater number of pixel cells to be arranged in a specific pixel cell array, thereby increasing the resolution of the array. In one process for forming micro-lenses, the radius of each micro-lens is correlated to the size of the pixel cell.

The micro-lenses refract incident radiation to the photosensor region, thereby increasing the amount of light reaching the photosensor and thereby increasing the fill factor of the imager. Other uses of micro-lens arrays include intensifying illuminating light on the pixel cells of a non-luminescent display device such as a liquid crystal display device to increase the brightness of the display, display associated with a camera, forming an image to be printed, and as focusing means for coupling a luminescent device or a receptive device to an optical fiber.

One source of image sensor noise is fixed pattern noise (FPN). FPN may manifest as a stationary background pattern in the image which is caused by mismatches in device parameters. FPN is the systematic signal difference between individual pixel cells or groups of pixel cells. FPN can have a variety of physical causes, including small local variations above each photosensor, differences in electronic response, and variations in the thin film stack above each photosensor, including variations of the color filter and micro-lens layers. FPN in a image sensor is typically around 1.0 to 1.2%, thus the signal to noise ratio due to FPN is about 40 dB.

There is needed, therefore, imaging devices for sensing objects which have reduced fixed pattern noise. A reduction of FPN of about 10 to 20% would improve the image quality that can be sensed by the eye. A 1-2% change in optical transmission, either for the full operating range of wavelengths or a portion thereof would result in an appreciable difference in the quality of the image. A method of reducing the fixed pattern noise of the imaging device and methods for fabricating the devices having reduced fixed pattern noise are also needed.

BRIEF SUMMARY OF THE INVENTION

The present invention provides imaging devices having reduced fixed pattern noise. The fixed pattern noise in the imaging devices is reduced by measuring and adjusting the spectral characteristics of the imager device on a pixel by pixel basis. The invention relates to changing the absorption, reflectance, refractive index, shape, and/or micro structure of the material. In particular, this invention is applicable for any micro-electronic or micro-optical device that requires low noise such as, for example, CCD imagers and CMOS imagers.

The present invention provides a method for reducing fixed pattern noise in a solid state imager having a pixel cell array, wherein the fixed pattern noise is reduced by first measuring the fixed pattern noise and then adjusting the spectral characteristics of the imager device on a pixel by pixel basis. The spectral characteristics that may be modified include the absorption, reflectance, refractive index, shape, and/or micro structure of the material on a pixel by pixel basis. In one embodiment of the invention a trim process is used to locally induce physical or chemical changes to the pixel cell. Examples of techniques used to trim the pixel cell include, for example, deposition of a thin film and subsequent beam induced localized ablation/etch of the thin film surface by ion beam or UV laser ablation; beam induced localized deposition; thermally induced change in surface micro structure; beam induced chemical surface change; and direct implantation of absorbing species into the surface layer. Also provided are methods for forming the imaging devices of the present invention having reduced fixed pattern noise.

Additional advantages and features of the present invention will be apparent from the following detailed description and drawings which illustrate preferred embodiments of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" and "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" or "pixel cell" refers to a picture element unit cell containing a photo-conversion device for converting electromagnetic radiation to an electrical signal. Typically, the fabrication of all pixel cells in an image sensor will proceed concurrently in a similar fashion.

Finally, while the invention is described with reference to a CMOS imager, it should be appreciated that the invention may be applied in any micro-electronic or micro-optical device that requires low noise for optimized performance. Other suitable micro-optical devices include CCDs and displays.

Figure 1:
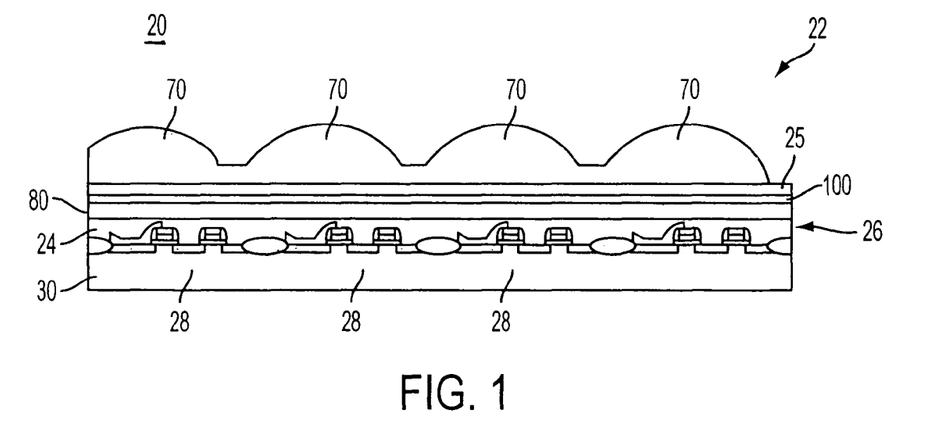
FIG. 1 is a side cross-sectional view illustrating the principal elements of a solid-state imager having a trim layer constructed under a color filter array in accordance with an exemplary embodiment of the present invention.

Referring now to the drawings, where like elements are designated by like reference numerals. A solid-state imager 20 is schematically illustrated in FIG. 1. The imager 20 comprises a trim layer 80 and a color filter layer 100 formed over a pixel cell array 26 as part of the same substrate 30, which may be any of the types of substrate described above. The pixel cell array 26 comprises a plurality of pixel sensor cells 28 formed in and over the substrate, and is covered by a protective layer 24 that acts as a passivation and planarization layer for the imager 20. Protective layer 24 may be a layer of BPSG, PSG, BSG, silicon dioxide, silicon nitride, polyimide, or other well-known light transmissive insulator.

The trim layer 80 may be formed of any material with suitable optical properties that can be inserted into the light path to modify the (angular) spectral intensity of an imager pixel cell. The trim layer 80 may be formed of any material that has the desired spectral transmission characteristics that can be adjusted by localized photon or particle beams. The materials forming the trim layer 80 are stable under normal storage and operating conditions of the device after trimming has been done. When the trim layer 80 is formed under the micro-lens 70, the trim layer 80 may be a thin film that is deposited onto the wafer or a thin metal layer that is formed over the protective layer 24 by conventional methods. These conventional methods for forming the trim layer 80 include, for example, sputtering or evaporative metal deposition. The metal may be any metal whose spectral characteristics can be adjusted by localized photon or particle beams and which is stable under normal storage and operating conditions of the device after spectral trimming has been performed. Examples of suitable metals for the trim layer 80 include, for example, tungsten or aluminum. Moreover, the trim layer 80 may be formed from amorphous carbon which may be deposited by conventional methods as understood by the person having ordinary skill in the art. The trim layer 80 may also be formed of other inorganic films such as, for example, metal oxides. As understood by those having ordinary skill in the art, materials that show slow transmission changes under light exposure or thermal stress (i.e., materials that undergo gradual irreversible chemical or physical phase changes under the influence of visible light and/or low or high temperatures). The trim layer 80 is formed such that the trim layer 80 does not significantly inhibit light from reaching the pixel sensor cells 28. The trim layer 80 preferably has a thickness of from about 1 angstrom to about 250 angstroms, preferably from about 5 to about 100 angstroms, more preferably from about 10 to about 75 angstroms, most preferably from about 15 to about 50 angstroms.

The physical and/or chemical characteristics of the trim layer 80 may be changed after the imager is formed to modify the spectral response of the imager 20. As discussed in more detail below, examples of techniques used to trim the pixel cell include, for example, deposition of a thin film and subsequent beam induced localized ablation/etch of the thin film surface by ion beam or UV laser ablation; beam induced localized deposition; thermally induced change in surface micro structure; beam induced chemical surface change; and direct implantation of absorbing species into the surface layer. For example, the trim layer 80 may be modified by using a laser, particle beams, ion beams, localized heating or infrared exposure. It should be understood that different lasers can change spectral components differently so that the FPN can be reduced on a pixel by pixel basis. Thus, each trim layer 80 may address a separate wavelength range by changing its spectral absorbance in response to localized heating or particle beam exposure, depending on the desired reduction in FPN needed for that specific pixel cell.

Figure 2:
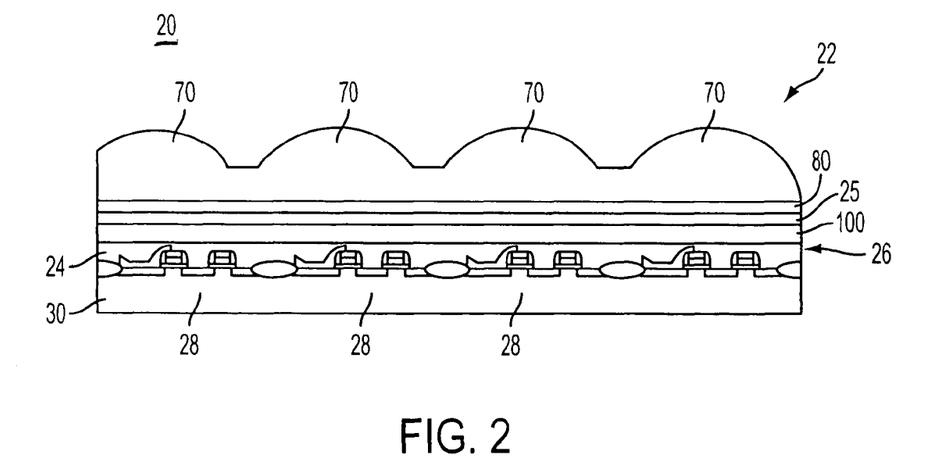
FIG. 2 is a side cross-sectional view illustrating the principal elements of a solid-state imager having a trim layer constructed above a color filter array yet below a micro-lens in accordance with an exemplary embodiment of the present invention.

Reference is now made to FIG. 2 which schematically illustrates a second embodiment of the solid-state imager 20 of the present invention. The illustrated embodiment comprises a trim layer 80 formed over the color filter layer 100 and spacer layer 25, the color filter layer 100 being formed over a pixel cell array 26 as part of the same substrate 30, which may be any of the types of substrate described above. The trim layer 80 may be formed of any of the materials discussed above with reference to FIG. 1.

Figure 3:
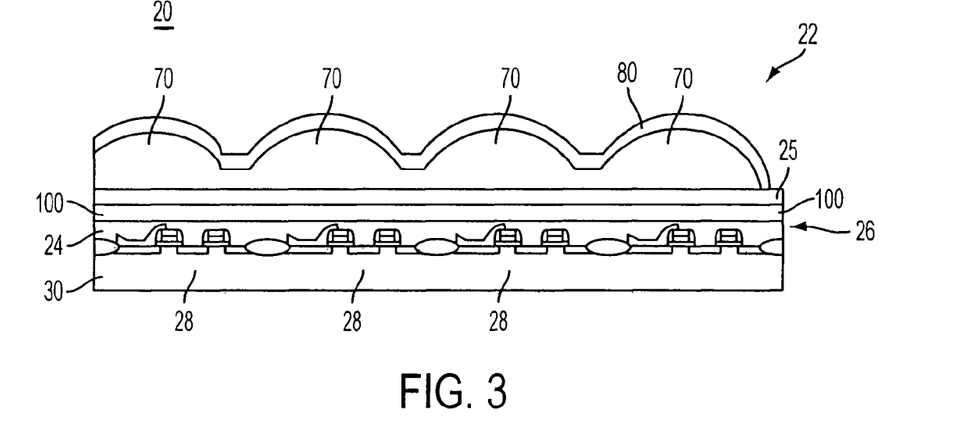
FIG. 3 is a side cross-sectional view illustrating the principal elements of a solid-state imager having a trim layer constructed above a micro-lens in accordance with an exemplary embodiment of the present invention.

Reference is now made to FIG. 3 which schematically illustrates a third embodiment of the solid-state imager 20 of the present invention which comprises a trim layer 80 formed over the micro-lens 70. The micro-lens 70 is formed over the color filter layer 100 and spacer layer 25, the color filter layer 100 being formed over a pixel cell array 26 as part of the same substrate 30, which may be any of the types of substrate described above. The trim layer 80 may be formed of any of the materials discussed above with reference to FIG. 1. However, since the trim layer 80 is formed after the micro-lens 70, the selection of the trim layer 80 is limited due to thermal constraints of the color filter layer 100 and micro-lens 70 during the deposition of the trim layer 80 because the spectral transmission of the color filter layer 100 and the micro-lens 70 may be affected by the processing temperature of the addition of the trim layer 80. Thus, when the trim layer 80 is formed above the micro-lens 70, the trim layer is preferably selected from materials such as thin silicon films and thin metal films that are deposited onto the micro-lens 70. Alternatively, the trim layer 80 can be selectively removed in selected areas of variable density, allowing a direction dependent transmission adjustment.

Figure 4:
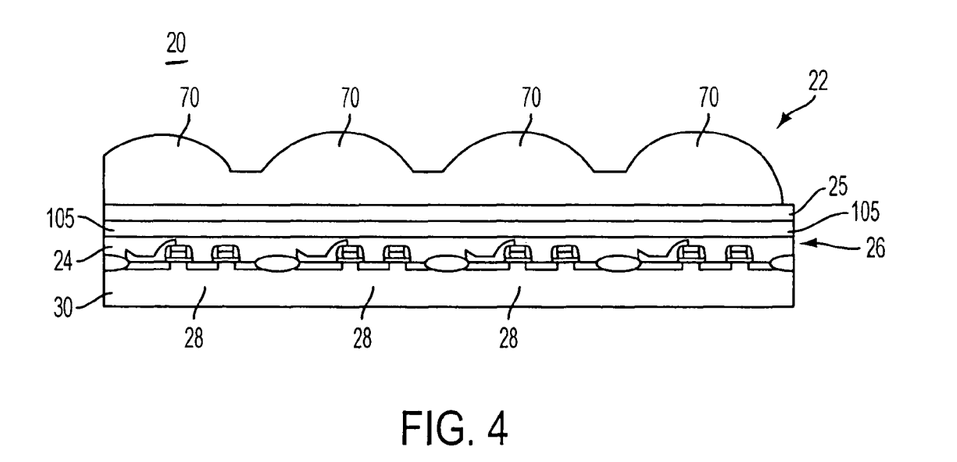
FIG. 4 is a side cross-sectional view illustrating the principal elements of a solid-state imager having a trim layer constructed above a micro-lens in accordance with an exemplary embodiment of the present invention.

Reference is now made to FIG. 4 which schematically illustrates a fourth embodiment of the solid-state imager 20 of the present invention which comprises a color filter layer 105 and spacer layer 25 formed over a pixel cell array 26 as part of the same substrate 30, which may be any of the types of substrate described above. In this embodiment, the color filter layer 105 is modified to reduce the FPN of the imager 20. For example, the color filter layer 105 can be formed of a color resist or acrylic material which is used as a light transmitting material. The color filter layer 105 may be modified by the addition of additional chemical adjuvants, such as, for example, monomers or other additives, that can be "bleached" to reduce their spectral absorption upon exposure to (UV) light. Thus, by destroying or changing the molecular structure of the color filter layer 105 or by causing absorption of the UV light inside the color filter layer 105, the spectral characteristics of the color filter layer 105 can be selectively modified.

Figure 5:
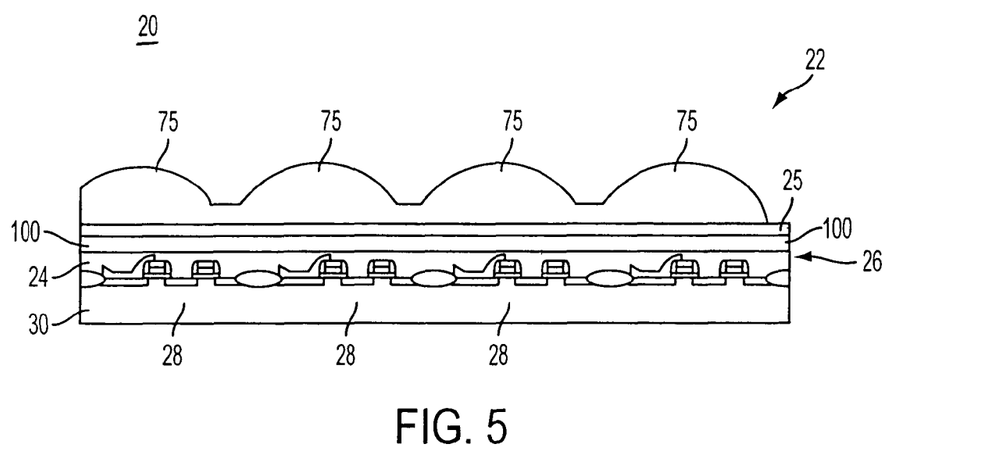
FIG. 5 is a side cross-sectional view illustrating the principal elements of a solid-state imager having a trim layer constructed above a micro-lens in accordance with an exemplary embodiment of the present invention.

Reference is now made to FIG. 5 which schematically illustrates a fifth embodiment of the solid-state imager 20 of the present invention which comprises a trimmable micro-lens 75 formed above the spacer layer 25 and color filter layer 100. The color filter layer 100 is formed over a pixel cell array 26 as part of the same substrate 30, which may be any of the types of substrate described above. In this embodiment, the trimmable micro-lens 75 may itself be modified to reduce the FPN of the imager 20. The trimmable micro-lens 75 may be modified by the addition of additional chemical adjuvants, such as, for example, additive monomers or other additives, that can be "bleached" to reduce their spectral absorption upon exposure to (UV) light. Thus, by destroying or changing the molecular structure of the trimmable micro-lens 75 or by causing absorption of the UV light inside the trimmable micro-lens 75, the spectral characteristics of the trimmable micro-lens 75 can be selectively modified.

Additionally, since the shape of the micro-lens 75 is the result of a thermal reflow process, rastering can create individual (and even anisotropic) reflow conditions for each micro-lens 75. While not wishing to be bound by theory, it is believed that the lower scan speed and higher temperature would produce a different reflow result and thus a different spectral response in the imager 20 by individually shaping the lens 75.

Figure 6:
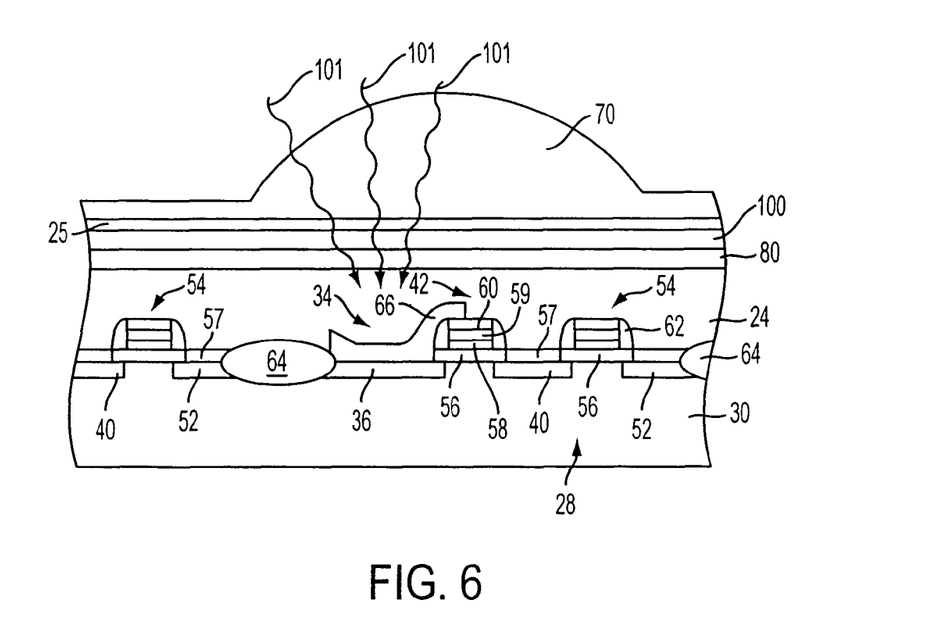
FIG. 6 illustrates a schematic cross-sectional view of a CMOS imager pixel cell having a color filter array constructed in accordance with an exemplary embodiment of the present invention.

Reference is now made to FIGS. 6-10. FIG. 6 shows an expanded view of the solid-state imager discussed above. The pixel array 26 shown in FIGS. 1-5 comprises a plurality of pixel sensor cells 28 formed in and over the substrate, and is covered by a protective layer 24 that acts as a passivation and planarization layer for the imager 20. Protective layer 24 may be a layer of BPSG, PSG, BSG, silicon dioxide, silicon nitride, polyimide, or other well-known light transmissive insulator.

The color filter layer 100 is formed over the passivation layer 24. The color filter layer 100 comprises an array of red, blue and green sensitive elements which may be arranged in a pattern understood by the person having ordinary skill in the art as exemplified by U.S. Pat. Nos. 6,783,900 and 3,971,065 which are herein incorporated by reference.

As also depicted in the figures, a micro-lens array 22 is formed so that micro-lens 70 are formed above each pixel cell. The micro-lens array 22 is formed such that the focal point of the array is centered over the photosensitive elements in each pixel cell. The device also includes a spacer layer 25 under the microlens array 22 and over the color filter layer 100. The thickness of spacer layer 25 is adjusted such that the photosensitive element is at a focal point for the light traveling through lenses 70 of micro-lens array 22.

Figure 7:
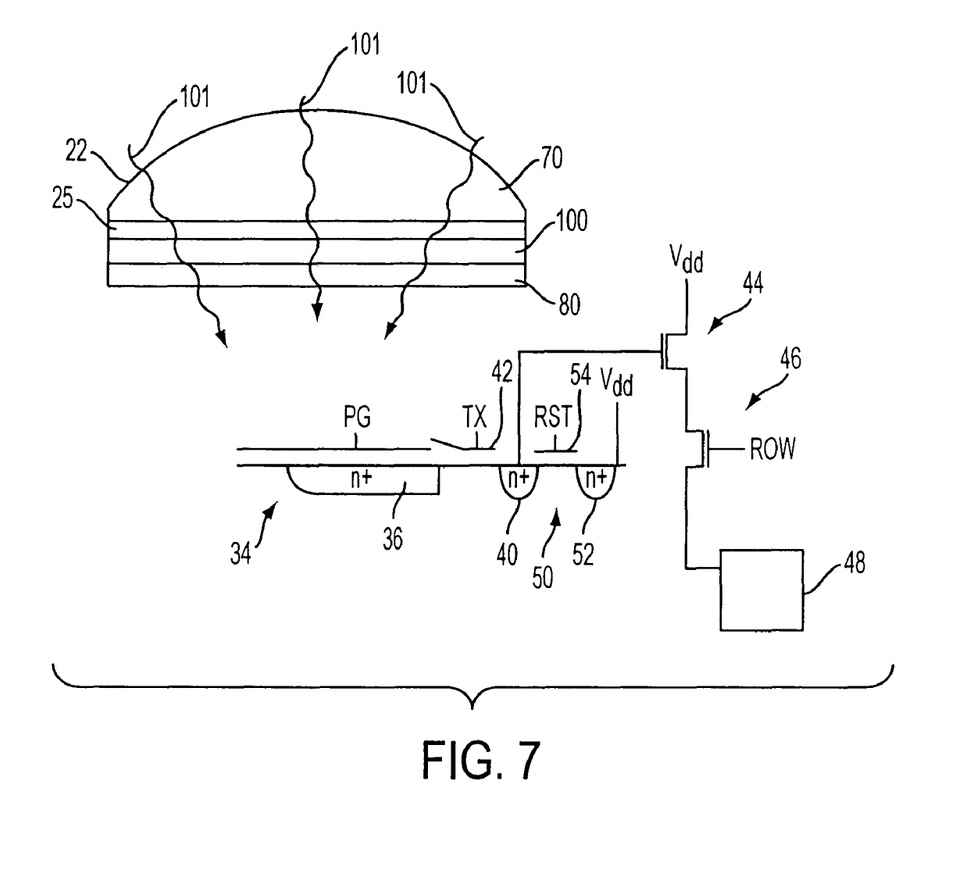
FIG. 7 is a representative diagram of the CMOS imager pixel cell of FIG. 6.

As shown in FIGS. 6-7, each pixel sensor cell contains a photosensor 34, which may be a photodiode, photogate, or the like. A photogate photosensor 34 is depicted in FIGS. 6-7. An applied control signal PG is applied to the photogate 34 so that when incident radiation 101 in the form of photons passes color filter layer 100 and strikes the photosensor 34, the photo-generated electrons accumulate in the doped region 36 under the photosensor 34. A transfer transistor 42 is located next to the photosensor 34, and has source and drain regions 36, 40 and a gate stack 42 controlled by a transfer signal TX. The drain region 40 is also called a floating diffusion region, and it passes charge received from the photosensor 34 to output transistors 44, 46 and then to readout circuitry 48. A reset transistor 50 comprised of doped regions 40, 52 and gate stack 54 is controlled by a reset signal RST which operates to reset the floating diffusion region 40 to a predetermined initial voltage just prior to signal readout. Details of the formation and function of the above-described elements of a pixel sensor cell may be found, for example, in U.S. Pat. Nos. 6,376,868 and 6,333,205, the disclosures of which are incorporated by reference herein.

As illustrated in FIG. 6, the gate stacks 42, 54 for the transfer 42 and reset 54 transistors include a silicon dioxide or silicon nitride insulator 56 on the substrate 30, which in this example is a p-type substrate, a conductive layer 58 of doped polysilicon, tungsten, or other suitable material over the insulating layer 56, and an insulating cap layer 60 of, for example, silicon dioxide, silicon nitride, or ONO (oxide-nitride-oxide). A silicide layer 59 may be used between the polysilicon layer 58 and the cap 60, if desired. Insulating sidewalls 62 are also formed on the sides of the gate stacks 42, 54. These sidewalls 62 may be formed of, for example, silicon dioxide, silicon nitride, or ONO. A field oxide layer 64 around the pixel sensor cell 28 serves to isolate it from other pixel cells in the array. A second gate oxide layer 57 may be grown on the silicon substrate and the photogate semi-transparent conductor 66 is patterned from this layer. In the case that the photosensor is a photodiode, no second gate oxide layer 57 and no photogate semi-transparent conductor 66 is required. Furthermore, transfer transistor 42 is optional, in which case the diffusion regions 36 and 40 are connected together.

The image devices 20 described above with reference to FIGS. 1-3 are manufactured through a process described as follows, and illustrated in FIGS. 8-10.

Figure 8:
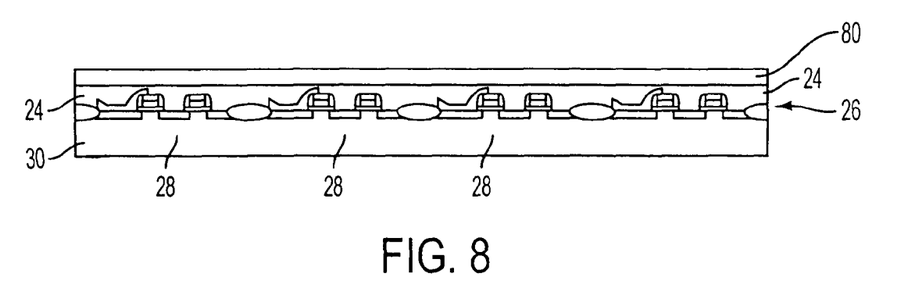
FIG. 8 illustrates a cross-sectional view of a semiconductor wafer undergoing the process of forming a color pattern layer according to an exemplary embodiment of the present invention.

Referring now to FIG. 8, a substrate 30, which may be any of the types of substrates described above, having a pixel cell array 26, peripheral circuits, contacts and wiring formed thereon by well-known methods, is provided. A protective layer 24 of BPSG, BSG, PSG, silicon dioxide, silicon nitride or the like is formed over the pixel cell array 26 to passivate it and to provide a planarized surface.

A trim layer 80 is formed over passivation layer 24 as shown in FIG. 8. The trim layer 80 may be formed of any material with suitable optical properties that can be inserted into the light path to modify the (angular) spectral intensity of an imager pixel cell. The trim layer 80 may be formed of any material that has the desired spectral transmission characteristics that can be adjusted by localized photon or particle beams. The materials forming the trim layer 80 are stable under normal storage and operating conditions of the device after trimming has been done. The trim layer 80 may be a thin film that is deposited onto wafer, such as, for example, a thin metal layer that is formed over the protective layer 24 by conventional methods. The conventional methods for forming the trim layer 80 include, for example, sputtering or evaporative metal deposition. Examples of suitable metals for the trim layer 80 include, for example, tungsten or aluminum. Moreover, the trim layer 80 may be formed from amorphous carbon which may be deposited by conventional methods as understood by the person having ordinary skill in the art. The trim layer 80 may also be formed of other inorganic films such as, for example, metal oxides. As understood by those having ordinary skill in the art, materials that show slow transmission changes under light exposure or thermal stress can be used to fabricate the trim layer 80.

Figure 9:
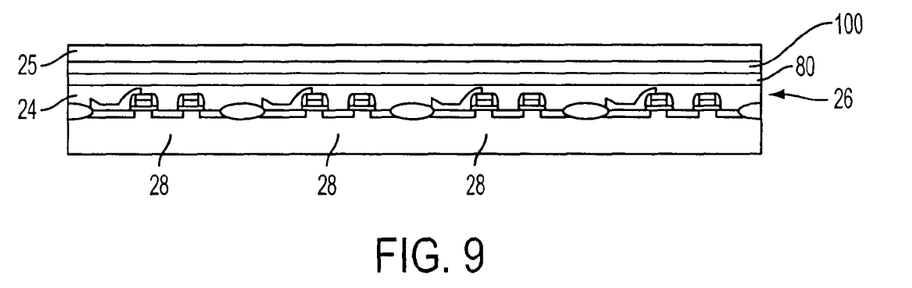
FIG. 9 illustrates the semiconductor wafer of FIG. 8 at a stage of processing subsequent to that shown in FIG. 8.
Figure 10:
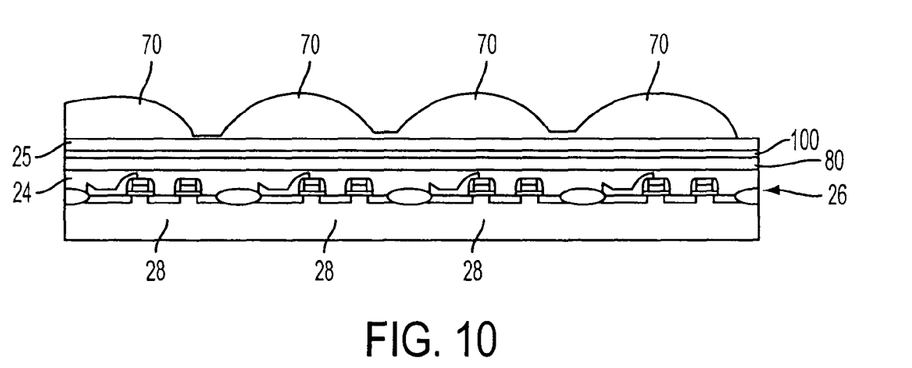
FIG. 10 illustrates the semiconductor wafer of FIG. 8 at a stage of processing subsequent to that shown in FIG. 9.

A color filter layer 100 is formed over the trim layer 80, as also shown in FIG. 9. The color filter layer 100 may be formed of a color resist or acrylic material which is used as a light transmitting material. For example, color filter layer 100 may be formed of a plurality of color filter layers, each of the plurality of color filter layers consisting of red filter regions (not shown), green filter regions (not shown) and blue filter regions (not shown), which are formed, for example, from resist or acrylic material of the respective color-filtering qualities. As such, red sensitive resist material, blue sensitive resist material and green sensitive resist material may be employed to form the red, blue and green sensitive elements of each of the plurality of color filter layers that form color filter layer 100. These red, blue and green elements may be formed in any pattern know to those skilled in the art. Other embodiments may employ other colored materials, such as paint or dye, as known in the art. The color filter layer 100 may be formed over the trim layer 80 by conventional deposition or spin-on methods, for example.

A spacing layer 25 is formed over the color filter layer 100, as illustrated in FIG. 9. Lenses 70 may then be formed, as shown in FIG. 10, from a lens forming layer, for example, so that each lens 70 overlies a pixel cell 28. Alternative constructions in which a lens 70 overlies multiple pixel cells 28 are also encompassed by the present invention. It should also be understood that the preceding examples discuss one embodiment of the present invention. Of course, it should be understood that other embodiments of the invention may be similarly fabricated with the trim layer 80 being located, for example, in the various positions discussed in FIGS. 1-5.

Figure 11:
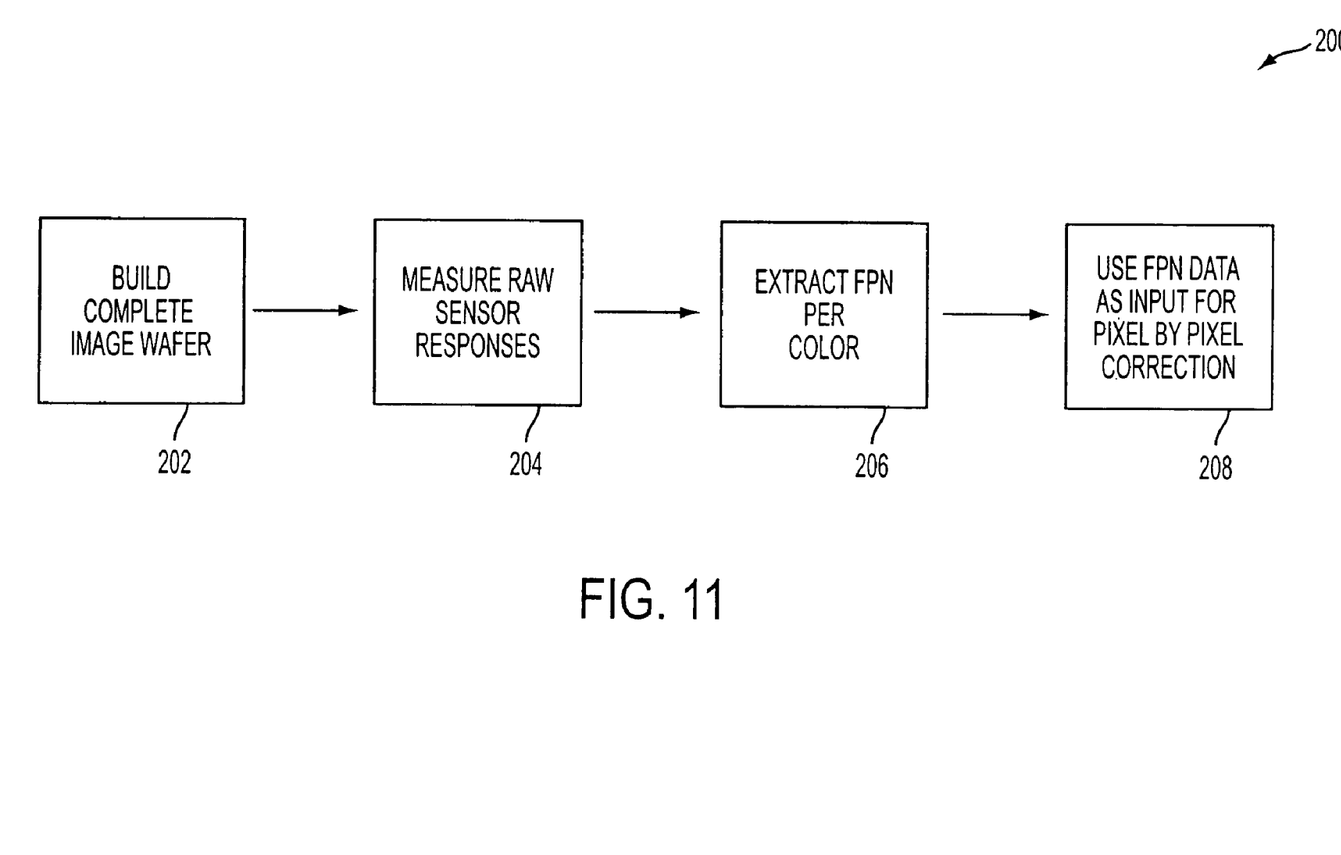
FIG. 11 is a schematic of the process for determining FPN reduction on a pixel by pixel basis.

Reference is now made to FIG. 11. FIG. 11 shows a method 200 for reducing FPN according to the present invention. As illustrated in this figure, the imager device is first built as discussed herein with reference to FIGS. 1-10 (step 202). After the imager device is built, the raw sensor responses are then measured (step 204). As understood by the person having ordinary skill in the art, the raw sensor responses are measured by observing the spectral transmission of imager 20. The FPN per pixel cell is then calculated based on the spectral observations (step 206). As set forth above, FPN in a image sensor is typically around 1.0 to 1.2%, thus the signal to noise ratio due to FPN is about 40 dB. A reduction of FPN of from 10 to 20% would improve the image quality that can be sensed by the eye. Likewise, a controlled 1-2% change in optical transmission, either for the full operating range of wavelengths or a portion thereof would suffice to achieve an appreciable difference in the quality of the image. The FPN data is then used as an input to perform pixel by pixel correction of FPN, thus improving the image quality of the device (step 208).

Examples of techniques used to perform pixel by pixel correction of the imager device in accordance with the acquired FPN data include, for example, deposition of a thin film and subsequent beam induced localized ablation/etch of the thin film surface by ion beam or UV laser ablation; beam induced localized deposition; thermally induced change in surface micro structure; beam induced chemical surface change; and direct implantation of absorbing species into the surface layer.

As discussed above with reference to FIGS. 1-10, the trim layer 80 may be deposited as a thin film. Based on the FPN data, the trim layer 80 may be selectively removed by beam induced localized ablation/etch of the thin film surface by ion beam or UV laser ablation, as understood by the person having ordinary skill in this art. Different materials, due to their physical or atomic or molecular structure, show certain optical spectral transmission properties. The thickness of the films can be modulated or their chemical composition or microstructure can be changed (e.g. phase change) under the influence of the localized photon or particle beam and thus the optical spectral transmission properties can be modified. Chemical reactions inside the film can be induced by the local heating or photon exposure of the trimming beam. In an alternative embodiment, it is understood that chemicals for the reaction due to the influence of the trimming beam can be present in the film as-deposited, by either being added in a second removable film for the trim layer 80 (not shown) or by adding the chemical in the gas atmosphere above the imager device during the trimming process. The resulting change in chemical composition or phase affects the spectral characteristics of the trim layer 80, thus enabling the correction of FPN for the specific pixel cell. It should be understood that conventional methods for trimming the layer 80 can be used. Examples include ion beam subtraction, UV laser ablation, changes in pulse energy or pulse duration of the ablation laser.

Another exemplary method for reducing the FPN of the imager includes beam induced localized deposition. Exemplary methods include using mask repair technology to selectively add, remove or modify the trim layer 80. For broad spectral response adjustment, very thin metal films are preferred. For more targeted spectral range adjustments, films with embedded dye molecules or functional molecular groups that change their spectral absorbance upon heating/irradiation can be used. These dyes could be destroyed by photons/heat/particle beams or generated by them, thereby modifying the spectral response of the imager pixel cell.

Yet another method for pixel by pixel FPN correction includes thermally induced change in surface micro structure of the device. Under this method, the trim layer 80, trimmed color filter layer 105 or trimmed micro-lens 75 can be modified by controlled local heating and cooling (thus effecting phase change of the material) and the surface roughness can be modified by structural rearrangement (i.e., phase change) of the surface molecules/atoms of the trim layer 80, trimmed color filter layer 105 or trimmed micro-lens 75. This thermally induced change can affect the spectral response of the imager pixel cell.

Yet another method for pixel by pixel FPN correction includes beam induced chemical surface change. As discussed above, energy from the particle beam can result in a phase change of the surface of the device. Tools suitable for use in this method are those which generate a localized particle beam, such as, for example, an e-beam writer, ion beam writer or the like that directs the beam at the surface of the substrate. Accelerated particles are 'shot' at the target (usually under vacuum) and implanted into the surface layer(s) of the target. They either act directly to modify its spectral transmission or can be induced to react (e.g. thermally) with trim layer 80, trimmed color filter layer 105 or trimmed micro-lens 75 and form absorbing molecules. This change can be used to reduce FPN of the pixel cell.

Another method for pixel by pixel FPN correction includes direct implantation of absorbing species into the rim layer 80, trimmed color filter layer 105 or trimmed micro-lens 75. For example, if the entire pixel cell is targeted for a uniform transmission change, a buried film close to the micro-lens focal point may be desirable. If light transmission from a certain angle is meant to be adjusted, trimming a film on top of the micro-lenses with small holes facing in the proper direction may be the method of choice.

While the process of forming the trim layer 80, the trimmed micro-lens 75 and the trimmed color filter layer 105 and selectively modifying these layers have been described with reference to a CMOS imager device, it should be understood that the process may be also used with pixel cells of other types of imagers as well, for example, with a CCD imager. Accordingly, the pixel cell formed as described above may be employed in CCD image sensors as well as CMOS image sensors. The imager devices of the present invention may also be formed as different size megapixel imagers, for example imagers having arrays in the range of about 0.1 megapixels to about 20 megapixels.

Figure 12:
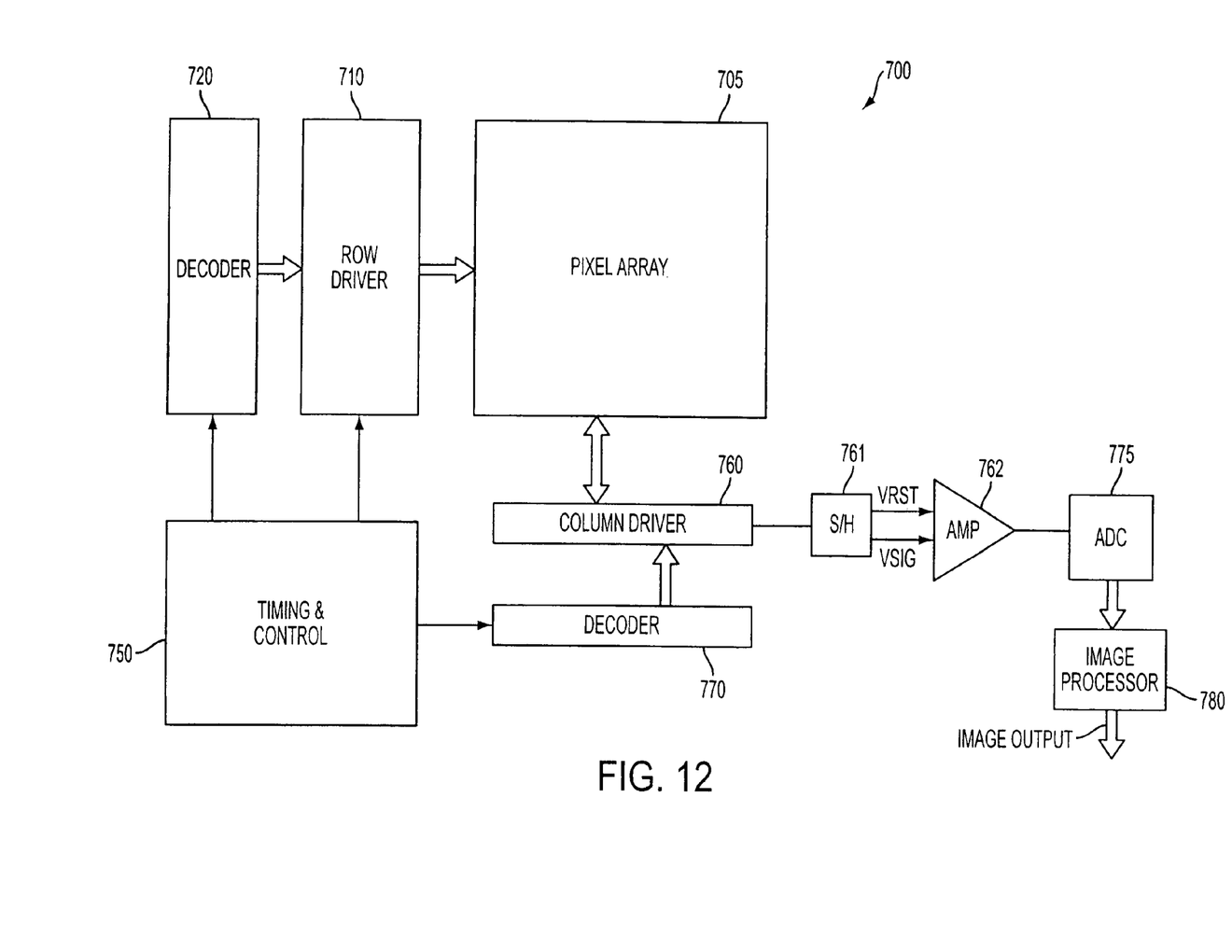
FIG. 12 shows an imager constructed in accordance with an embodiment of the invention.

FIG. 12 illustrates an exemplary imager 700 that may utilize any embodiment of the invention. The Imager 700 has a pixel array 705 comprising pixels constructed as described above with respect to FIGS. 1-10, or using other pixel architectures. Row lines are selectively activated by a row driver 710 in response to row address decoder 720. A column driver 760 and column address decoder 770 are also included in the imager 700. The imager 700 is operated by the timing and control circuit 750, which controls the address decoders 720, 770. The control circuit 750 also controls the row and column driver circuitry 710, 760.

A sample and hold circuit 761 associated with the column driver 760 reads a pixel reset signal Vrst and a pixel image signal Vsig for selected pixels. A differential signal (Vrst–Vsig) is amplified by differential amplifier 762 for each pixel and is digitized by analog-to-digital converter 775 (ADC). The analog-to-digital converter 775 supplies the digitized pixel signals to an image processor 780 which forms a digital image.

Figure 13:
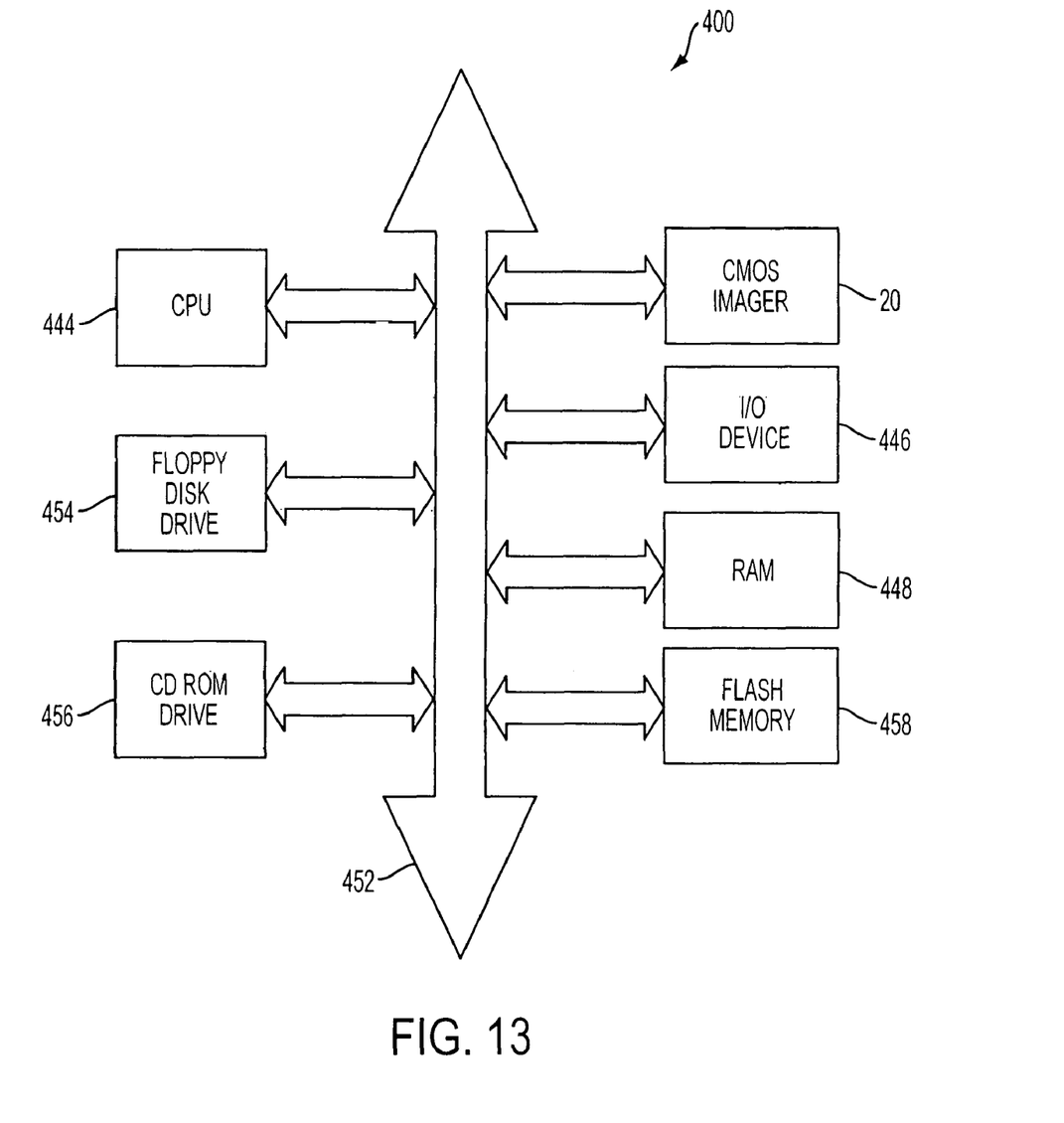
FIG. 13 is an illustration of an imaging system having an imager with reduced fixed pattern noise according to an exemplary embodiment of the present invention.

If desired, the imager 20 may be combined with a processor, such as a CPU, digital signal processor or microprocessor. The imager 20 and the microprocessor may be formed in a single integrated circuit. An exemplary processor system 400 using a CMOS imager having a filter array in accordance with the present invention is illustrated in FIG. 13. A processor based system is exemplary of a system having digital circuits which could include CMOS or other imager devices. Without being limiting, such a system could include a computer system, camera system, scanner, machine vision system, vehicle navigation system, video telephone, surveillance system, auto focus system, star tracker system, motion detection system, image stabilization system and other image processing systems.

As shown in FIG. 13, an exemplary processor system 400, for example, a camera generally comprises a central processing unit (CPU) 444, e.g., a microprocessor, that communicates with an input/output (I/O) device 446 over a bus 452. The imager 20 also communicates with the system over bus 452. The computer system 400 also includes random access memory (RAM) 448, and may include peripheral devices such as a floppy disk drive 454, a compact disk (CD) ROM drive 456 or a flash memory 458 which also communicate with CPU 444 over the bus 452. The floppy disk 454, the CD ROM 456 or flash memory 458 stores images captured by imager 20. The imager 20 is preferably constructed as an integrated circuit, with or without memory storage, as previously described with respect to FIGS. 1-10.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. An imager comprising:
   an array of pixel sensor cells comprising a plurality of pixel cells formed at an upper surface of a substrate;
   a trim layer formed over said array;
   a color filter layer formed over said array; and
   an array of micro-lenses formed over said array, wherein spectral properties of said trim layer are selectively modifiable in portions of said trim layer corresponding to individual pixel cells.

2. The imager according to claim 1, wherein said trim layer is formed below said array of micro-lenses and said color filter layer.

3. The imager according to claim 1, wherein said trim layer is formed between said color filter layer and said array of micro-lenses.

4. The imager according to claim 1, wherein said trim layer is formed over said array of micro-lenses.

5. The imager according to claim 1, wherein said trim layer has a thickness of from about 1 angstrom to about 100 angstroms.

6. The imager according to claim 1, wherein said trim layer is a thin film.

7. The imager according to claim 6, wherein said thin film is a metal.

8. The imager according to claim 7, wherein said metal is selected from the group consisting of tungsten and aluminum.

9. The imager according to claim 6, wherein said thin film is a metal oxide.

10. The imager according to claim 6, wherein said thin film is amorphous carbon.

11. The imager according to claim 1, wherein said trim layer is modifiable to change the physical properties of the trim layer at selected locations.

12. The imager according to claim 11, wherein said physical properties are selected from the group consisting of absorption, reflectance, refractive index, shape, and micro structure.

13. The imager according to claim 1, wherein said spectral properties of said trim layer are modifiable to reduce fixed pattern noise of said imager.

14. An processor system comprising:
   an array of pixel sensor cells comprising a plurality of pixel cells formed at an upper surface of a substrate;
   a trim layer formed over said array;
   a color filter layer formed over said array;
   an array of micro-lenses formed over said array, wherein spectral properties of said trim layer are selectively modifiable in portions of said trim layer corresponding to individual pixel cells to reduce fixed pattern noise of said imager; an
   a processor for receiving and processing data representing the image.

15. The processor system of claim 14, wherein said arrays and said processor are formed on a single substrate.

16. The processor system according to claim 14, wherein said trim layer is formed below said array of micro-lenses and said color filter layer.

17. The processor system according to claim 14, wherein said trim layer is formed between said color filter layer and said array of micro-lenses.

18. The processor system according to claim 14, wherein said trim layer is formed over said array of micro-lenses.

19. The processor system according to claim 14, wherein said trim layer is a thin film.

20. The processor system according to claim 19, wherein said thin film is a metal.

21. The processor system according to claim 20, wherein said metal is selected from the group consisting of tungsten and aluminum.

22. The processor system according to claim 19, wherein said thin film is a metal oxide.

23. The processor system according to claim 19, wherein said thin film is amorphous carbon.

24. The processor system according to claim 19, wherein said trim layer is modifiable to change the physical properties of the trim layer.

25. The processor system according to claim 24, wherein said physical properties are selected from the group consisting of absorption, reflectance, refractive index, shape, and micro structure.

26. An imager comprising:
   an array of pixel sensor cells comprising a plurality of pixel cells formed at an upper surface of a substrate;
   a trim layer formed over said array;
   a color filter layer formed over said array; and
   an array of micro-lenses formed over said array, wherein said trim layer has been spectrally modified in portions of said trim layer corresponding to individual pixel cells.

* * * * *

UNITED STATES PATENT AND TRADEMARK OFFICE
CERTIFICATE OF CORRECTION

PATENT NO. : 7,808,063 B2  Page 1 of 1
APPLICATION NO. : 11/137446
DATED : October 5, 2010
INVENTOR(S) : Ulrich C. Boettige et al.

It is certified that error appears in the above-identified patent and that said Letters Patent is hereby corrected as shown below:

In column 12, line 4, in Claim 14, delete "An" and insert -- A --, therefor.

In column 12, line 13, in Claim 14, delete "an" and insert -- and --, therefor.

In column 12, line 38, in Claim 24, delete "claim 19," and insert -- claim 14, --, therefor.

Signed and Sealed this

Seventh Day of December, 2010

David J. Kappos
*Director of the United States Patent and Trademark Office*